(12) United States Patent
Furuie

(10) Patent No.: US 9,246,130 B2
(45) Date of Patent: Jan. 26, 2016

(54) ORGANIC ELECTROLUMINESCENCE DISPLAY DEVICE

(71) Applicant: Japan Display Inc., Tokyo (JP)

(72) Inventor: Masamitsu Furuie, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/471,037

(22) Filed: Aug. 28, 2014

(65) Prior Publication Data

US 2015/0060821 A1 Mar. 5, 2015

(30) Foreign Application Priority Data

Aug. 29, 2013 (JP) ................................. 2013-178676

(51) Int. Cl.

| G02F 1/1339 | (2006.01) |
|---|---|
| H01L 51/52 | (2006.01) |
| H01L 51/10 | (2006.01) |
| H01L 21/00 | (2006.01) |
| H01L 27/32 | (2006.01) |

(52) U.S. Cl.
CPC .......... *H01L 51/5253* (2013.01); *H01L 27/322* (2013.01); *H01L 51/524* (2013.01); *H01L 51/525* (2013.01); *H01L 51/5281* (2013.01); *H01L 27/3244* (2013.01)

(58) Field of Classification Search
CPC ............ H01L 29/7869; H01L 27/1225; H01L 29/66969; H01L 21/02565
USPC ........................... 257/448, 207, 208, E21.582
See application file for complete search history.

(56) References Cited

U.S. PATENT DOCUMENTS

| 6,501,529 B1* | 12/2002 | Kurihara | G02F 1/13338 345/173 |
|---|---|---|---|
| 7,113,234 B2* | 9/2006 | Chang | G02F 1/136213 349/139 |
| 7,133,108 B2* | 11/2006 | Shimizu | G02F 1/13394 349/155 |
| 7,452,738 B2* | 11/2008 | Hayashi | H01L 51/5237 438/29 |
| 7,825,998 B2* | 11/2010 | Chen | G02F 1/13338 345/173 |
| 2003/0214006 A1* | 11/2003 | Nakamura | G02F 1/136286 257/448 |
| 2005/0023964 A1 | 2/2005 | Omura et al. | |
| 2005/0218396 A1* | 10/2005 | Tsuchiya | H01L 27/3246 257/13 |
| 2005/0242713 A1* | 11/2005 | Yamazaki | H01L 51/5284 313/503 |

(Continued)

FOREIGN PATENT DOCUMENTS

| JP | 2004-335267 A | 11/2004 |
|---|---|---|
| JP | 2005-005166 A | 1/2005 |

(Continued)

OTHER PUBLICATIONS

Office Action dated Oct. 29, 2015 regarding a corresponding Korean Patent Application No. 10-2014-0111540.

*Primary Examiner* — Mary Wilczewski
*Assistant Examiner* — Tsz Chiu
(74) *Attorney, Agent, or Firm* — Lowe Hauptman & Ham, LLP

(57) ABSTRACT

An organic electroluminescence display device includes a thin film transistor substrate and a counter substrate, in which the thin film transistor substrate includes: a moisture blocking area that surrounds an outside of the display area and is made of only an inorganic material between the first substrate and the sealing film, and an auxiliary area between the display area and the moisture blocking area, and a thickness of areas of the counter substrate opposite to the auxiliary area and the moisture blocking area is thinner than a thickness of an area of the counter substrate opposite to the display area.

7 Claims, 7 Drawing Sheets

(56) References Cited

U.S. PATENT DOCUMENTS

| | | | |
|---|---|---|---|
| 2006/0284204 A1* | 12/2006 | Yamazaki | H01L 27/322 257/98 |
| 2006/0286889 A1* | 12/2006 | Nishi | H01L 27/3244 445/24 |
| 2007/0085112 A1* | 4/2007 | Yamazaki | H01L 21/28008 257/288 |
| 2008/0001533 A1* | 1/2008 | Kim | H01L 27/3251 313/504 |
| 2009/0309489 A1 | 12/2009 | Takata et al. | |

FOREIGN PATENT DOCUMENTS

| | | |
|---|---|---|
| JP | 2008-47515 A | 2/2008 |
| JP | 2009-134984 A | 6/2009 |

\* cited by examiner

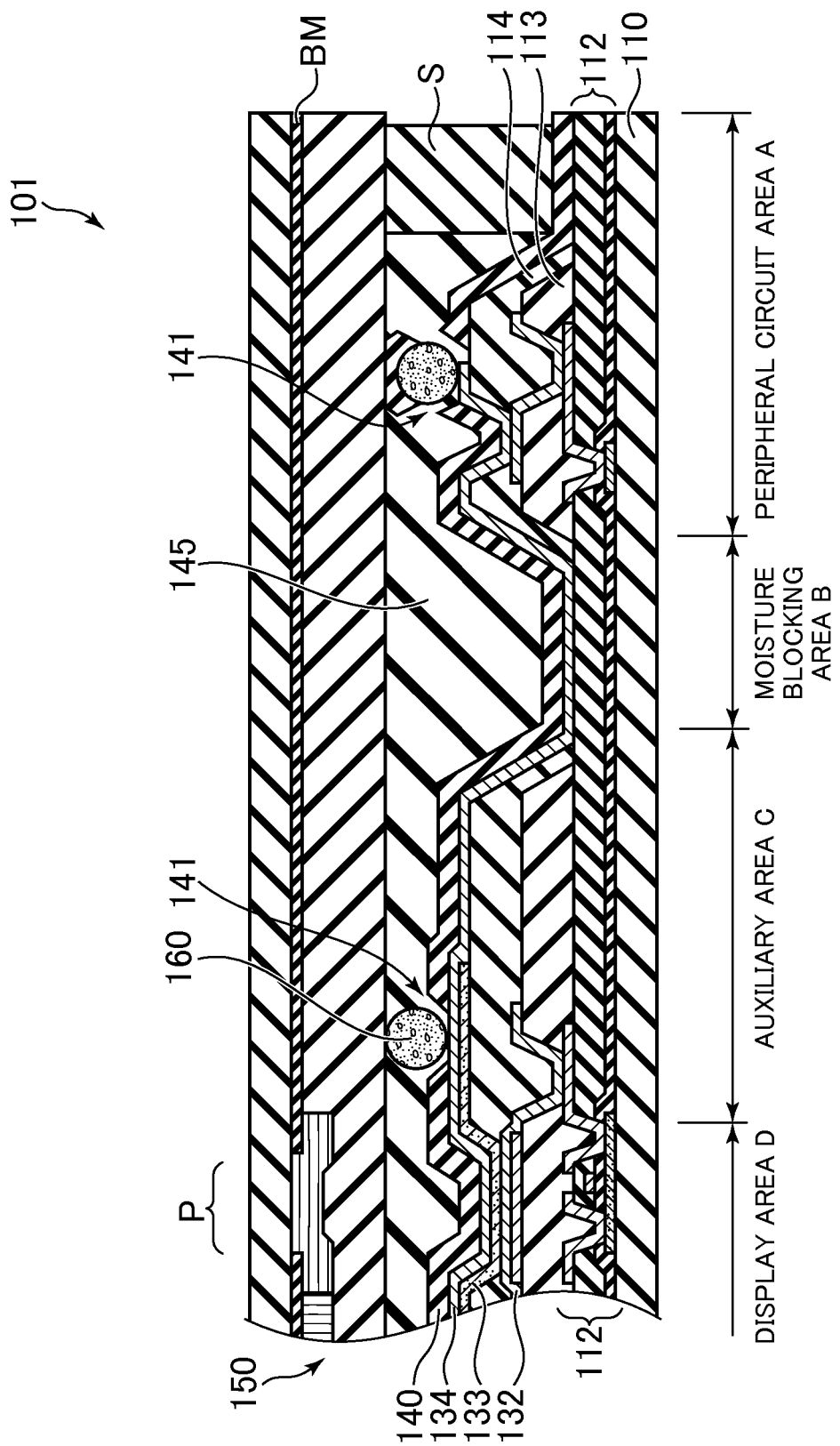

ORGANIC ELECTROLUMINESCENCE DISPLAY DEVICE

CROSS-REFERENCE TO RELATED APPLICATIONS

The present application claims priority from Japanese application JP 2013-178676 filed on Aug. 29, 2013, the content of which is hereby incorporated by reference into this application.

BACKGROUND OF THE INVENTION

1. Field of the Invention

The present invention relates to an organic electroluminescence display device.

2. Description of Related Art

As a thin and lightweight light emitting source, attention has been paid to organic electroluminescent element light emitting elements. Image display devices having a large number of organic electroluminescent light emitting elements have been developed. The organic electroluminescent light emitting element has a structure in which an organic layer having a light emitting layer is sandwiched between an anode and a cathode.

As an organic electroluminescence display device of this type, for example JP 2008-047515 A discloses a configuration in which a discontinuous part of a flattening layer is formed in a non-display area that surrounds an outside of a display area. Also, JP 2004-335267 A discloses a configuration in which an organic interlayer insulating film in a peripheral area surrounding an outside of a pixel area is divided.

SUMMARY OF THE INVENTION

FIG. 7 is a schematic cross-sectional view of a related art organic electroluminescence display device 101. The organic electroluminescence display device 101 includes a circuit layer 112 that is formed on a substrate 110, a flattening film 113 that is made of an organic material, a pixel separation film 114 that is made of an organic material and partitions an anode 132 for each pixel P, the anodes 132 formed in the respective pixels P, an organic layer 133 that covers the anodes 132 over an overall display area D in which a light emitting layer included in the organic layer 133 emits a light in the respective pixels P to display an image, a cathode 134 that is formed over the entire display area D, a sealing film 140 that covers the cathode 134, and a counter substrate 150 that is arranged over the sealing film 140 through a filler 145 and a sealant S.

The organic electroluminescence display device 101 formed by laminating organic and inorganic films on each other as described above is segmented into the display area D, an auxiliary area C that surrounds an outside of the display area D, a moisture blocking area B that surrounds an outside of the auxiliary area C, and a peripheral circuit area A that surrounds an outside of the moisture blocking area B.

Since the organic layer 133 is deteriorated with the absorption of moisture to cause a display trouble, the respective films formed over the substrate 110 are covered with the sealing film 140 to block moisture. However, the sealing film 140 may be damaged in a manufacturing process thereof. For example, it is conceivable that one factor of damage resides in that a foreign matter 160 enters between the substrate 110 and the counter substrate 150 in a process of overlapping the substrate 110 with the counter substrate 150.

In the inspection of the organic electroluminescence display device 101, the display area D is usually lighted to detect a failure of the organic layer 133. In particular, if damage 141 occurs in the auxiliary area C, it takes time that moisture penetrated from the damage 141 disperses into the display area D. This makes it difficult to detect the defect due to inspection of the display area D.

The invention has been made in view of the above circumstances, and aims at realizing an improvement in the reliability of the organic electroluminescence display device.

(1) According to the invention, there is provided an organic electroluminescence display device, including: a thin film transistor substrate in which anodes formed in respective pixels in a display area of a first substrate, an organic layer that comes in contact with the anodes and includes at least a light emitting layer, a cathode that covers the organic layer over the overall display area, and a sealing film that covers the overall first substrate are formed on the first substrate which is an insulating substrate in order; and a counter substrate that is arranged on the sealing film and has a second substrate which is an insulating substrate as a base material, in which the thin film transistor substrate includes: a moisture blocking area that surrounds an outside of the display area and is made of only an inorganic material between the first substrate and the sealing film, and an auxiliary area between the display area and the moisture blocking area, and in which a thickness of areas of the counter substrate opposite to the auxiliary area and the moisture blocking area is thinner than a thickness of an area of the counter substrate opposite to the display area.

(2) According to the invention, in the organic electroluminescence display device according to the item (1), the counter substrate has a protective film that faces at least the display area on a surface of the second substrate on the sealing film side, and the counter substrate has no protective film in areas opposite to the auxiliary area and the moisture blocking area so that the thickness of the areas of the counter substrate opposite to the auxiliary area and the moisture blocking area is thinner than the thickness of the area of the counter substrate opposite to the display area.

(3) According to the invention, in the organic electroluminescence display device according to the item (2), the counter substrate has a light blocking film formed in at least the area of the counter substrate opposite to a boundary of the pixels in the display area between the second substrate and the protective film, and the counter substrate has no light blocking film in areas opposite to the auxiliary area and the moisture blocking area so that the thickness of the areas of the counter substrate opposite to the auxiliary area and the moisture blocking area is thinner than the thickness of the area of the counter substrate opposite to the display area.

(4) According to the invention, in the organic electroluminescence display device according to any one of the items (1) to (3), the thin film transistor substrate has a peripheral circuit area that surrounds an outside of the moisture blocking area, and the thickness of the areas of the counter substrate opposite to the auxiliary area and the moisture blocking area is thinner than the thickness of the area of the counter substrate opposite to the peripheral circuit area.

(5) According to the invention, in the organic electroluminescence display device according to the item (4), the counter substrate has color filters that pass a light of a given wavelength region in areas opposite to the respective pixels in the display area between the protective film and the light blocking film, and the color filters are formed in the area of the counter substrate opposite to the peripheral circuit area.

(6) According to the invention, in the organic electroluminescence display device according to the item (4) or (5), the thin film transistor substrate has a peripheral circuit area that surrounds an outside of the moisture blocking area, and the thickness of the area of the counter substrate opposite to the peripheral circuit area is thinner than the thickness of the area of the counter substrate opposite to the display area.

(7) According to the invention, in the organic electroluminescence display device according to any one of the items (1) to (6), a spacer is arranged between the counter substrate and the sealing film in the display area to hold a distance between the counter substrate and the sealing film.

According to any one of the above items (1) to (7), as compared with the organic electroluminescence display device without the above configuration, a pressure is inhibited from being applied to the sealing film in the auxiliary area and the moisture blocking area. For that reason, the sealing film can be prevented from being damaged in the auxiliary area, and an improvement in the reliability of the organic electroluminescence display device can be realized.

BRIEF DESCRIPTION OF THE DRAWINGS

FIG. 7 is a schematic cross-sectional view of a part of a display area in a related art organic electroluminescence display device.

DETAILED DESCRIPTION OF THE INVENTION

Hereinafter, an organic electroluminescence display device according to an embodiment of the invention will be described with an organic electroluminescence display device 1 as an example with reference to the accompanying drawings. The drawings referred to in the following description may illustrate an enlarged portion of the features for convenience in order to facilitate understanding of the features, and the size ratio of the respective components is not always identical with a real one. Also, the materials exemplified in the following description are exemplary, and the respective components may be made of materials different from the exemplified materials, and can be implemented with changes without departing from the spirit thereof.

Figure 1:
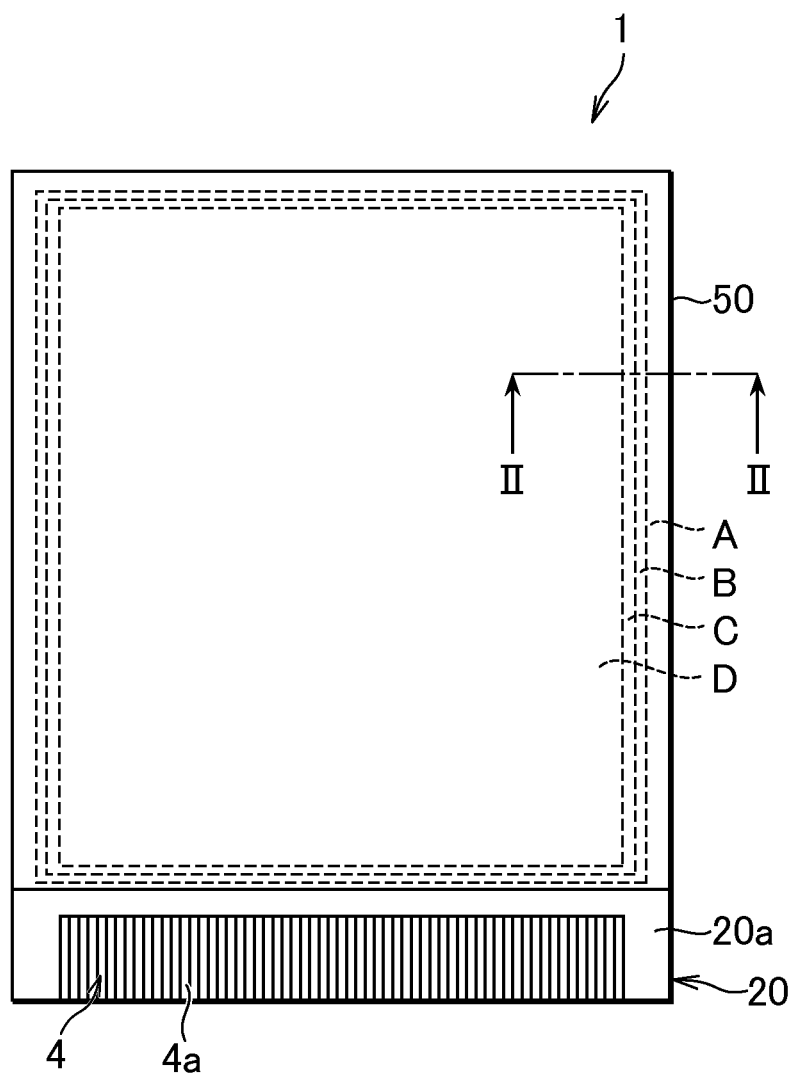
FIG. 1 is a schematic plan view of an organic electroluminescence display device according to the invention.

FIG. 1 is a schematic plan view of the organic electroluminescence display device 1 according to the invention. The organic electroluminescence display device 1 includes a thin film transistor substrate 20, and a counter substrate 50 arranged to face apart of the thin film transistor substrate 20. An external connection terminal part 4 is disposed in an area of an upper surface 20a of the thin film transistor substrate 20 in which the counter substrate 50 is not arranged. The external connection terminal part 4 is a terminal part that is electrically connected with an external device, and formed with plural terminals 4a which are spaced apart from each other.

The external connection terminal part 4 is supplied with image data from an external to supply a voltage signal to be supplied to respective pixels to organic electroluminescent light emitting elements 30 which will be described later through a driver IC (integrated circuit) not shown.

As illustrated in FIG. 1, the thin film transistor substrate has a display area D in which the organic electroluminescent light emitting elements 30 are formed, an auxiliary area C that surrounds an outside of the display area D, a moisture blocking area B that surrounds an outside of the auxiliary area C, and a peripheral circuit area A that surrounds an outside of the moisture blocking area B.

Figure 2:
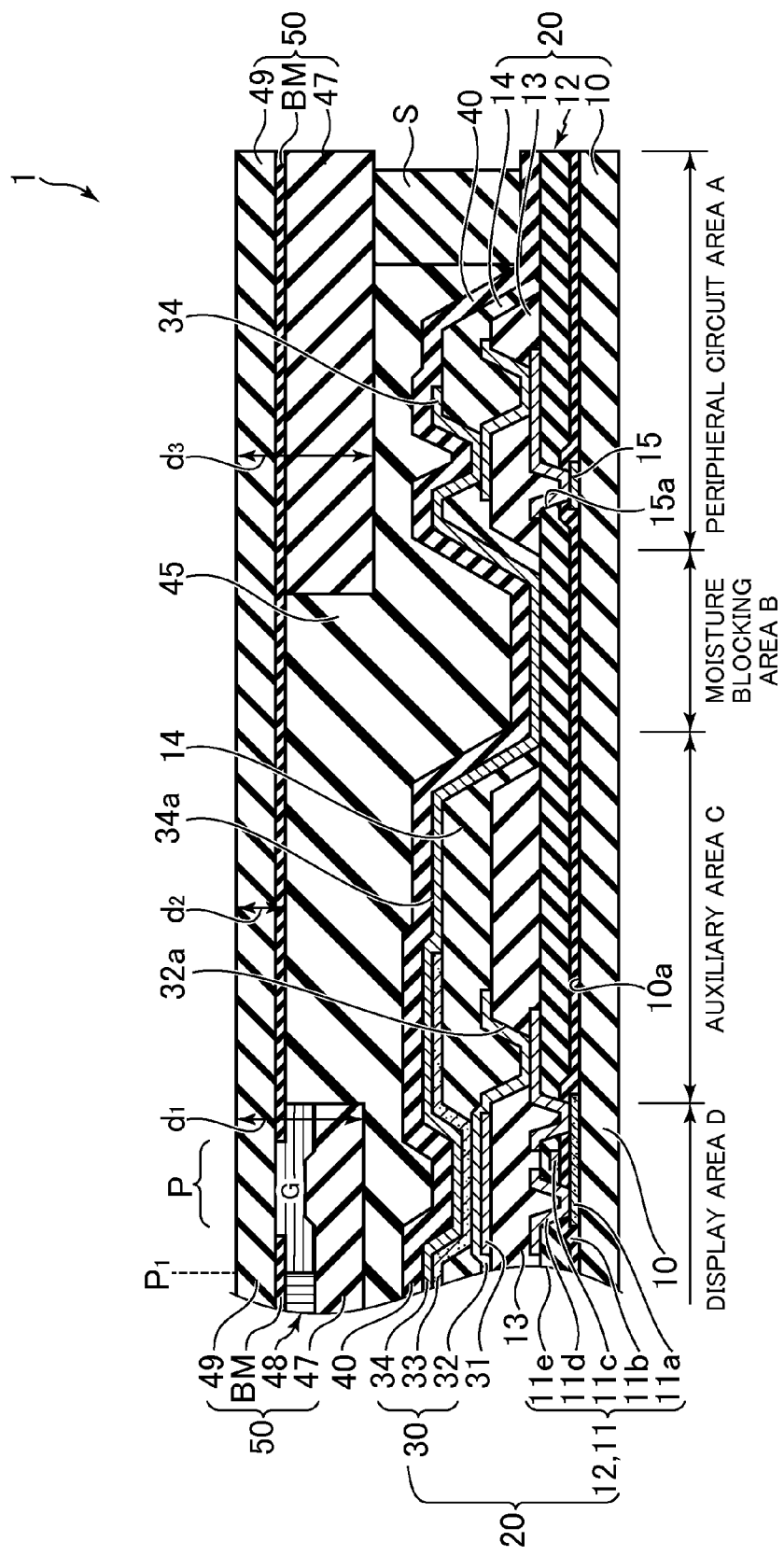
FIG. 2 is a schematic cross-sectional view taken along a line II-II of the organic electroluminescence display device illustrated in FIG. 1.

FIG. 2 is a schematic cross-sectional view taken along a line II-II of the organic electroluminescence display device 1 illustrated in FIG. 1. Hereinafter, a description will be given of configurations of the respective areas D, C, B, and A of the thin film transistor substrate 20, and respective areas of the counter substrate 50 opposite to the respective areas D, C, B, and A, in detail.

The display area D is an area for displaying an image which is formed with the organic electroluminescent light emitting elements 30. The thin film transistor substrate 20 in the display area D are formed with a first substrate 10 which is an insulating substrate, a circuit layer 12 having thin film transistors 11 which are formed on the first substrate 10, a flattening film 13, a pixel separation film 14, the organic electroluminescent light emitting elements 30, and a sealing film 40 that covers the overall first substrate 10 in stated order.

The first substrate 10 is an insulating substrate made of an insulating material, and the circuit layer 12, the flattening film 13, the pixel separation film 14, and the organic electroluminescent light emitting elements 30 are formed on an upper surface 10a of the first substrate 10.

The circuit layer 12 is a layer on which the thin film transistors 11 and electric lines not shown are formed, and formed to drive the organic electroluminescent light emitting elements 30. The thin film transistors 11 are disposed on the first substrate 10 for the respective pixels P. Specifically, for example, the thin film transistors 11 each include a polysilicon semiconductor layer 11a, a first insulating film 1ib, a gate electrode 11c, a source/drain electrode 11d, and a second insulating film 11e.

The flattening film 13 is a layer made of an insulating material, and formed to cover the circuit layer 12. The flattening film 13 is formed between the first substrate 10 and the organic electroluminescent light emitting elements 30, to thereby electrically isolate the adjacent thin film transistors 11 from each other, or the thin film transistors 11 and the organic electroluminescent light emitting elements 30 from each other. The flattening film 13 can be made of a material having an insulating property such as $SiO_2$, SiN, acrylic or polyimide. For the purpose of flattening, the flattening film 13 is mainly made of acrylic or polyimide which is an organic material.

Also, the flattening film 13 is formed with first contact holes 32a that electrically connect the thin film transistors 11 and the organic electroluminescent light emitting elements 30.

Reflective films 31 may be formed in regions corresponding to the respective pixels P on the flattening film 13. The respective reflective films 31 are disposed to reflect the light emitted from the organic electroluminescent light emitting elements 30 toward the counter substrate 50 side. The reflective films 31 are preferably higher in optical reflectivity, and can be formed of a metal film made of, for example, aluminum or silver (Ag).

The plural organic electroluminescent light emitting elements 30 are formed on the flattening film 13, for example, through the reflective films 31 so as to correspond to the respective pixels P. The organic electroluminescent light emitting elements 30 each include an anode 32, an organic layer 33 having at least a light emitting layer, and a cathode 34 formed to cover the organic layer 33 to function as a light emitting source.

The anode 32 is an electrode for injecting a drive current into the organic layer 33, and formed on the first substrate 10 of the display area D for each pixel P. The anode 32 is connected to a first contact hole 32a so as to be electrically connected to the thin film transistor 11, and the drive current is supplied from the thin film transistors 11.

The anode 32 is made of a material having a conductive property. Specifically, it is preferable that the anode 32 is made of, for example, ITO (indium tin oxide). Alternatively, the anode 32 may be made of a material having translucency and conductivity such as IZO (indium zinc complex oxide), tin oxide, zinc oxide, indium oxide, or aluminum composite oxide. When the respective reflective films 31 are made of metal such as silver, and come in contact with the anodes 32, the reflective films 31 function as a part of the anodes 32.

The pixel separation film 14 is formed between the respective adjacent anodes 32 along the boundary of the respective adjacent pixels P. The pixel separation film 14 has a function of preventing a contact between the respective adjacent anodes 32, and a leakage current between the anode 32 and the cathode 34. The pixel separation film 14 is made of an insulating material, and specifically made of, for example, a photosensitive resin composition.

The organic layer 33 is a layer made of an organic material, and having at least a light emitting layer, and formed to come in contact with the anode 32. The organic layer 33 may be formed for each of the pixels P, or may be formed to cover the entire area of the display area D in which the pixels P are arranged. The organic layer 33 has a layer that emits light, and the emitted light may be white or another color.

The organic layer 33 is configured so that, for example, a hole injection layer, a hole transport layer, a light emitting layer, an electron transport layer, and an electron injection layer not shown are laminated in order from the anode 32 side. A laminated structure of the organic layer 33 is not limited to the above case, but the laminated structure is not specified if the organic layer 33 includes at least the light emitting layer.

The light emitting layer is made of an organic electroluminescence material that emits light by coupling holes with electrons. The organic electroluminescence material of this type to be used may be a material generally used as, for example, an organic light emitting material.

The cathode 34 is formed to cover the organic layer 33 over the overall display area D. With the provision of the above configuration, the cathode 34 commonly contacts with the respective organic layers 33 of the plural organic electroluminescent light emitting elements 30 in the display area D.

The cathode 34 is made of a material having the translucency and the conductivity. It is specifically preferable that the cathode 34 is made of ITO. Alternatively, the cathode 34 may be made of a conductive metal oxide such as ITO or InZnO mixed with metal such as silver or magnesium, or a laminate of a metal thin film made of silver or magnesium, and the conductive metal oxide.

An upper surface 34a of the cathode 34 is covered with the sealing film 40 over the plural pixels P. The sealing film 40 is a transparent film made of an insulating material which covers the overall first substrate 10 to prevent oxygen or moisture from penetrating into the respective layers including the organic layer 33.

The upper surface of the sealing film 40 is covered with the counter substrate 50 through a filler 45 and a sealant S which are made of, for example, an organic material. The counter substrate 50 is arranged on the sealing film 40 so as to face the substrate 10.

The counter substrate 50 in the display area D has a second substrate 49 that is an insulating substrate as a base material, and a light blocking film BM, a color filter 48, and a protective film 47 are formed on a lower side which is the sealing film 40 side toward the sealing film 40 side in the stated order. The counter substrate 50 in the display area D has only to include at least the second substrate 49 and the protective film 47, and also may have a configuration other than that described above.

The light blocking film BM is a film formed to partition the respective pixels P so as to block the light emitted from the organic layer 33. The light blocking film BM of this type can be made of, a metal material such chrome, or black resin. The light blocking film BM is formed to correspond to, at least, a boundary $P_1$ between the respective adjacent pixels P in the display area D. Specifically, for example, the light blocking film BM is formed between the second substrate 49 and the protective film 47 in the area corresponding to the boundary $P_1$.

If the light emitting layer of the organic layer 33 emits a white light, the color filter 48 may be formed between the protective film 47 and the light blocking film BM. The color filter 48 is a filter that passes a light of a given wavelength region in an area opposite to each pixel P in the display area D. FIG. 2 illustrates an example in which a filter G that passes, for example, a green light is formed.

The protective film 47 is a film formed to protect a surface of the second substrate 49 on the sealing film 40 side, and a material of the protective film 47 is not limited if a transparent insulating material is used. The protective film 47 is formed on the surface of the second substrate 49 on the sealing film 40 side so as to face at least the display area D. The protective film 47 in this embodiment is formed to cover, for example, a surface of the color filter 48 on the sealing film 40 side.

Subsequently, a description will be given of a configuration of the thin film transistor substrate 20 and the counter substrate 50 in the auxiliary area C and the moisture blocking area B. The auxiliary area C is an area between the display area D and the moisture blocking area B, and formed to surround an outside of the display area D. The auxiliary area C is provided to eliminate a step between the display area D of the thin film transistor substrate 20, and the moisture blocking area B of the thin film transistor substrate 20.

Also, the moisture blocking area B is an area that surrounds an outside of the display area D and the auxiliary area C, and provided to prevent moisture penetrated from the peripheral circuit area A side from diffusing into the display area D side.

The thin film transistor substrate 20 in the auxiliary area C is different from the thin film transistor substrate 20 in the display area D at least in that the thin film transistors 11 and the organic electroluminescent light emitting elements 30 are not formed. Specifically, for example, in the thin film transistor substrate 20 in the auxiliary area C, the first insulating film 11b, the second insulating film 11e, the flattening film 13, the pixel separation film 14, the cathode 34, and the sealing film 40 are laminated on the first substrate 10 in the stated order.

Also, the thin film transistor substrate 20 in the moisture blocking area B is made of only an inorganic material between the first substrate 10 and the cathode 34. Specifically, for example, the thin film transistor substrate 20 in the moisture blocking area B has none of the flattening film 13 and the pixel separation film 14 which are made of an organic material. The first insulating film 11b, the second insulating film 11e, the cathode 34, and the sealing film 40 are laminated on the first substrate 10 in the stated order.

Areas of the counter substrate 50 opposite to the auxiliary area C and the moisture blocking area B are formed to be thinner than a thickness of the area of the counter substrate 50 opposite to the display area D for the purpose of preventing the sealing film 40 from being damaged in the auxiliary area C. Specifically, for example, as illustrated in FIG. 2, the areas of the counter substrate 50 opposite to the auxiliary area C and the moisture blocking area B have none of the protective film 47 and the color filter 48, and have only the second substrate 49 and the light blocking film BM.

With the provision of the above configuration, a thickness $d_2$ of the areas of the counter substrate 50 opposite to the auxiliary area C and the moisture blocking area B is thinner than a thickness $d_1$ of the area of the counter substrate 50 opposite to the display area D by the thickness of the protective film 47 and the color filter 48.

In the organic electroluminescence display device 1 according to this embodiment, the thickness $d_2$ of the areas of the counter substrate 50 opposite to the auxiliary area C and the moisture blocking area B is thinner than the thickness $d_1$ of the area of the counter substrate 50 opposite to the display area D. As a result, as compared with the organic electroluminescence display device without the above configuration, an interval between the sealing film 40 and the counter substrate 50 in the auxiliary area C and the moisture blocking area B is larger.

For that reason, the counter substrate 50 is arranged on the sealing film 40 in the auxiliary area C, to thereby inhibit a pressure from being applied to the sealing film 40 through the filler 45. Also, even if a foreign matter not shown enters between the sealing film 40 and the counter substrate 50, the foreign matter is prevented from damaging the sealing film 40 by the pressure from the counter substrate 50. As a result, the damage of the sealing film 40 in the auxiliary area C, and the penetration of moisture from the damaged portion are prevented without changing the thickness of the organic electroluminescence display device 1. As a result, an improvement in the reliability of the organic electroluminescence display device 1 can be realized.

Also, in the organic electroluminescence display device 1 according to this embodiment, since the areas of the counter substrate 50 opposite to the auxiliary area C and the moisture blocking area B have no protective film 47, the thickness $d_2$ thereof is thinner than the thickness $d_1$ of the area of the counter substrate 50 opposite to the display area D by at least the thickness of the protective film 47. For that reason, as compared with the organic electroluminescence display device without the above configuration, a difference between the thickness $d_1$ and the thickness $d_2$ is ensured. As a result, the damage of the sealing film 40 in the auxiliary area C, and the penetration of moisture from the damaged portion are prevented.

Figure 3:
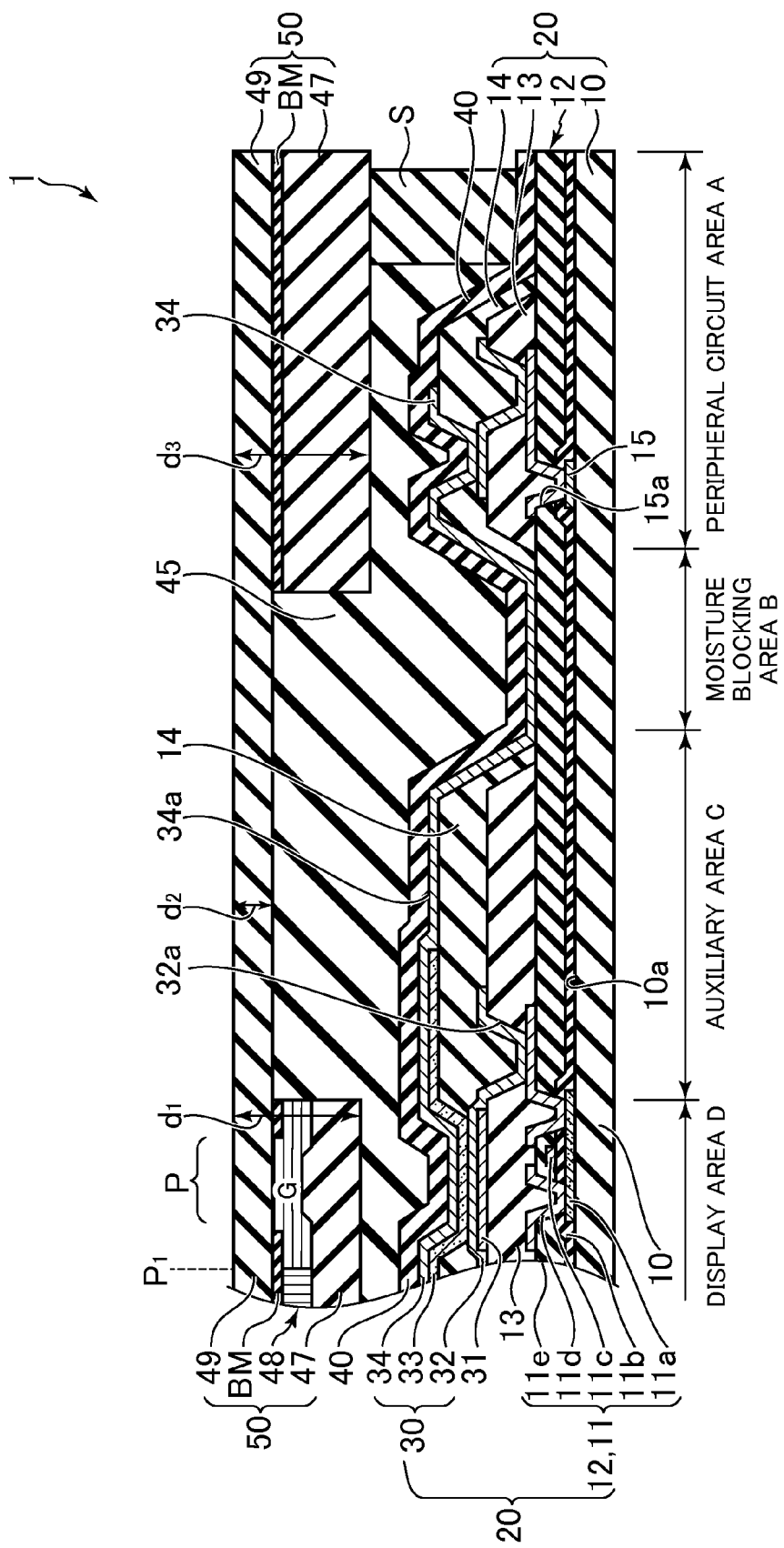
FIG. 3 is a schematic cross-sectional view illustrating one modification of the organic electroluminescence display device illustrated in FIG. 2, in the same view as that in FIG. 2.

The areas of the counter substrate 50 opposite to the auxiliary area C and the moisture blocking area B may have another configuration different from that described above if the thickness $d_2$ is thinner than the thickness $d_1$ of the area of the counter substrate 50 opposite to the display area D. FIG. 3 is a schematic cross-sectional view illustrating one modification of the organic electroluminescence display device illustrated in FIG. 2, in the same view as that in FIG. 2.

Specifically, for example, as illustrated in FIG. 3, the areas of the counter substrate 50 opposite to the auxiliary area C and the moisture blocking area B do not have the light blocking film BM, and may be configured by only the second substrate 49.

With the provision of the above configuration, the thickness $d_2$ of the areas of the counter substrate 50 opposite to the auxiliary area C and the moisture blocking area B is thinner than the thickness $d_1$ of the area of the counter substrate 50 opposite to the display area D by the thickness of the protective film 47, the color filter 48 and the light blocking film BM.

As described above, the areas of the counter substrate 50 opposite to the auxiliary area C and the moisture blocking area B do not have the protective film 47 as well as the light blocking film BM. As a result, the thickness $d_2$ of the areas of the counter substrate 50 opposite to the auxiliary area C and the moisture blocking area B is thinner than the thickness $d_1$ of the area of the counter substrate 50 opposite to the display area D by at least the thickness of the protective film 47 and the light blocking film BM. For that reason, as compared with the organic electroluminescence display device without the above configuration, a difference between the thickness $d_1$ and the thickness $d_2$ is ensured. As a result, the damage of the sealing film 40 in the auxiliary area C, and the penetration of moisture from the damaged portion are prevented, and an improvement in the reliability of the organic electroluminescence display device 1 can be realized.

Subsequently, a description will be given of a configuration of the thin film transistor substrate 20 and the counter substrate 50 in the peripheral circuit area A. The peripheral circuit area A is an area that surrounds an outside of the moisture blocking area B, in which a circuit 15 connected to the organic electroluminescent light emitting elements 30 in the display area D is formed.

In the configuration of the thin film transistor substrate 20 in the peripheral circuit area A, specifically, for example, the circuit 15, the first insulating film 11b, the second insulating film 11e, a second contact hole 15a connected to the circuit 15, the flattening film 13, the pixel separation film 14, the cathode 34 connected to the second contact hole 15a, and the sealing film 40 are laminated in the stated order. The configuration of the thin film transistor substrate 20 in the peripheral circuit area A is not limited to this example, but the configuration is not particularly limited if the circuit 15 is formed.

The area of the counter substrate 50 opposite to the peripheral circuit area A is formed for protecting the thin film transistor substrate 20 in the peripheral circuit area A. A thickness $d_3$ of the area of the counter substrate 50 opposite to the peripheral circuit area A may be thicker than the thickness $d_2$ of the areas of the counter substrate 50 opposite to the auxiliary area C and the moisture blocking area B.

Specifically, for example, as illustrated in FIGS. 2 and 3, the area of the counter substrate 50 opposite to the peripheral circuit area A may have the second substrate 49, the light blocking film BM, and the protective film 47. With the provision of the above configuration, the thickness $d_3$ of the areas of the counter substrate 50 opposite to the peripheral circuit area A is thicker than the thickness $d_2$ of the areas of the counter substrate 50 opposite to the auxiliary area C and the moisture blocking area B by the thickness of the light blocking film BM and the protective film 47.

As described above, the thickness $d_2$ of the areas of the counter substrate 50 opposite to the auxiliary area C and the moisture blocking area B is thinner than the thickness $d_3$ of the area of the counter substrate 50 opposite to the peripheral circuit area A. As a result, as compared with the organic electroluminescence display device without the above configuration, a pressure to be applied to the sealing film 40 through the filler 45 in the auxiliary area C disperses. For that reason, the damage of the sealing film 40 in the auxiliary area C can be prevented, and an improvement in the reliability of the organic electroluminescence display device 1 can be realized.

Figure 4:
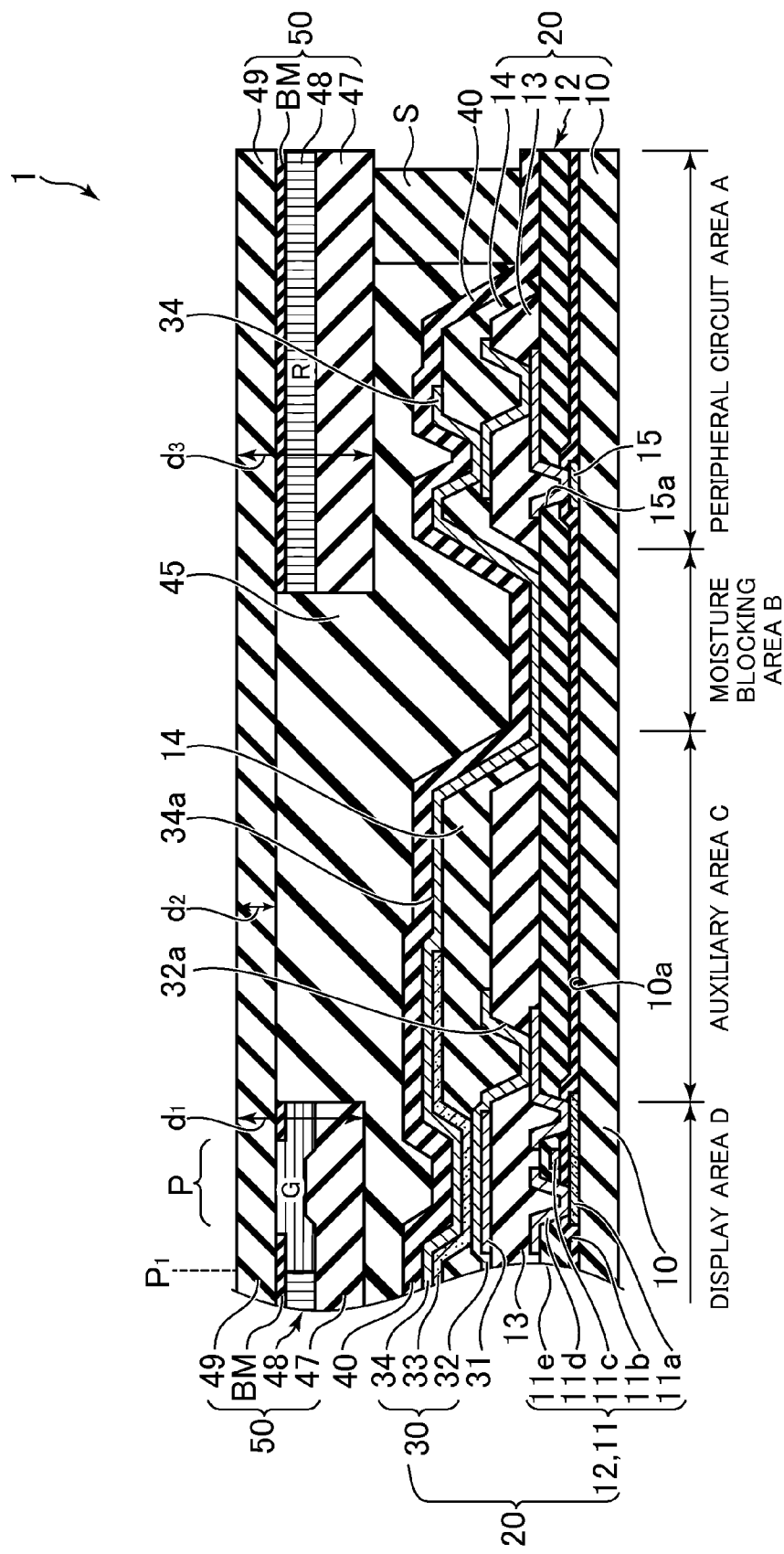
FIG. 4 is a schematic cross-sectional view illustrating another modification of the organic electroluminescence display device illustrated in FIG. 2, in the same view as that in FIG. 2.

FIG. 4 is a schematic cross-sectional view illustrating another modification of the organic electroluminescent display 1 device illustrated in FIG. 2, in the same view as that in FIG. 2.

As illustrated in FIG. 4, an area of the counter substrate 50 opposite to the peripheral circuit area A may be formed with the second substrate 49, the light blocking film BM, and the protective film 47 as well as the color filter 48. With the provision of the above configuration, the thickness $d_3$ is thicker than the thickness $d_2$ of the areas of the counter substrate 50 opposite to the auxiliary area C and the moisture blocking area B by the thickness of the protective film 47, the color filter 48, and the light blocking film BM.

As described above, the color filter 48 is also formed in the peripheral circuit area A as in the display area D. As a result, as compared with the organic electroluminescence display device without the above configuration, a difference between the thickness $d_3$ of the area of the counter substrate 50 opposite to the peripheral circuit area A, and the thickness $d_2$ of the areas of the counter substrate 50 opposite to the auxiliary area C and the moisture blocking area B comes closer to a difference between the thickness $d_1$ of the area of the counter substrate 50 opposite to the display area D and the thickness $d_2$.

For that reason, the pressure applied to the sealing film 40 through the filler 45 in the auxiliary area C evenly disperses as compared with the organic electroluminescence display device without the above configuration. For that reason, the damage of the sealing film 40 in the auxiliary area C can be prevented, and an improvement in the reliability of the organic electroluminescence display device 1 can be realized.

Figure 5:
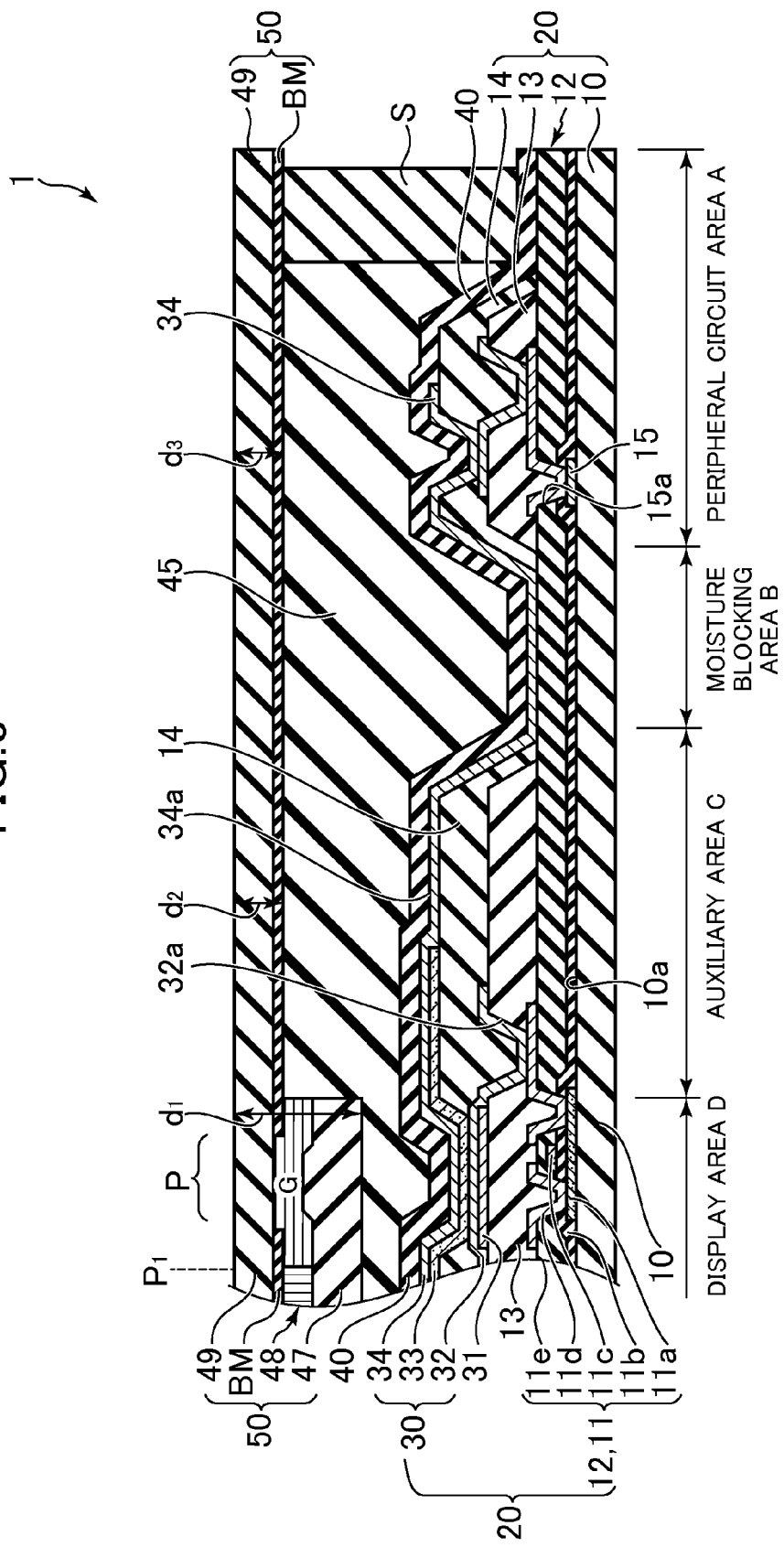
FIG. 5 is a schematic cross-sectional view illustrating still another modification of the organic electroluminescence display device illustrated in FIG. 2, in the same view as that in FIG. 2.

Also, the thickness $d_3$ of the area of the counter substrate 50 opposite to the peripheral circuit area A may be thinner than the thickness $d_1$ of the area of the counter substrate 50 opposite to the display area D. FIG. 5 is a schematic cross-sectional view illustrating still another modification of the organic electroluminescence display device 1 illustrated in FIG. 2, in the same view as that in FIG. 2. Specifically, for example, as illustrated in FIG. 5, the areas of the counter substrate 50 opposite to the auxiliary area C, the moisture blocking area B, and the peripheral circuit area A each have none of the protective film 47 and the color filter 48, but may have only the second substrate 49 and the light blocking film BM. With the provision of the above configuration, the thickness $d_3$ is the same as the thickness $d_2$ of the areas of the counter substrate 50 opposite to the auxiliary area C and the moisture blocking area B.

As described above, the thickness $d_3$ of the areas of the counter substrate 50 opposite to the peripheral circuit area A is thinner than the thickness $d_1$ of the area of the counter substrate 50 opposite to the display area D. As a result, as compared with the organic electroluminescence display device without the above configuration, a volume filled with the filler 45 increases outside of the display area D. As a result, a pressure to be applied to the sealing film 40 through the filler 45 in the auxiliary area C disperses. For that reason, the damage of the sealing film 40 in the auxiliary area C can be prevented, and an improvement in the reliability of the organic electroluminescence display device 1 can be realized.

The configurations of the thin film transistor substrate 20 and the counter substrate 50 in the respective areas D, C, B, and A have been described above. However, the organic electroluminescence display device 1 is not limited to the above configuration, but may have another configuration if the thickness $d_2$ of the areas of the counter substrate 50 opposite to the auxiliary area C and the moisture blocking area B is thinner than the thickness $d_1$ of the area of the counter substrate 50 opposite to the display area D.

Figure 6:
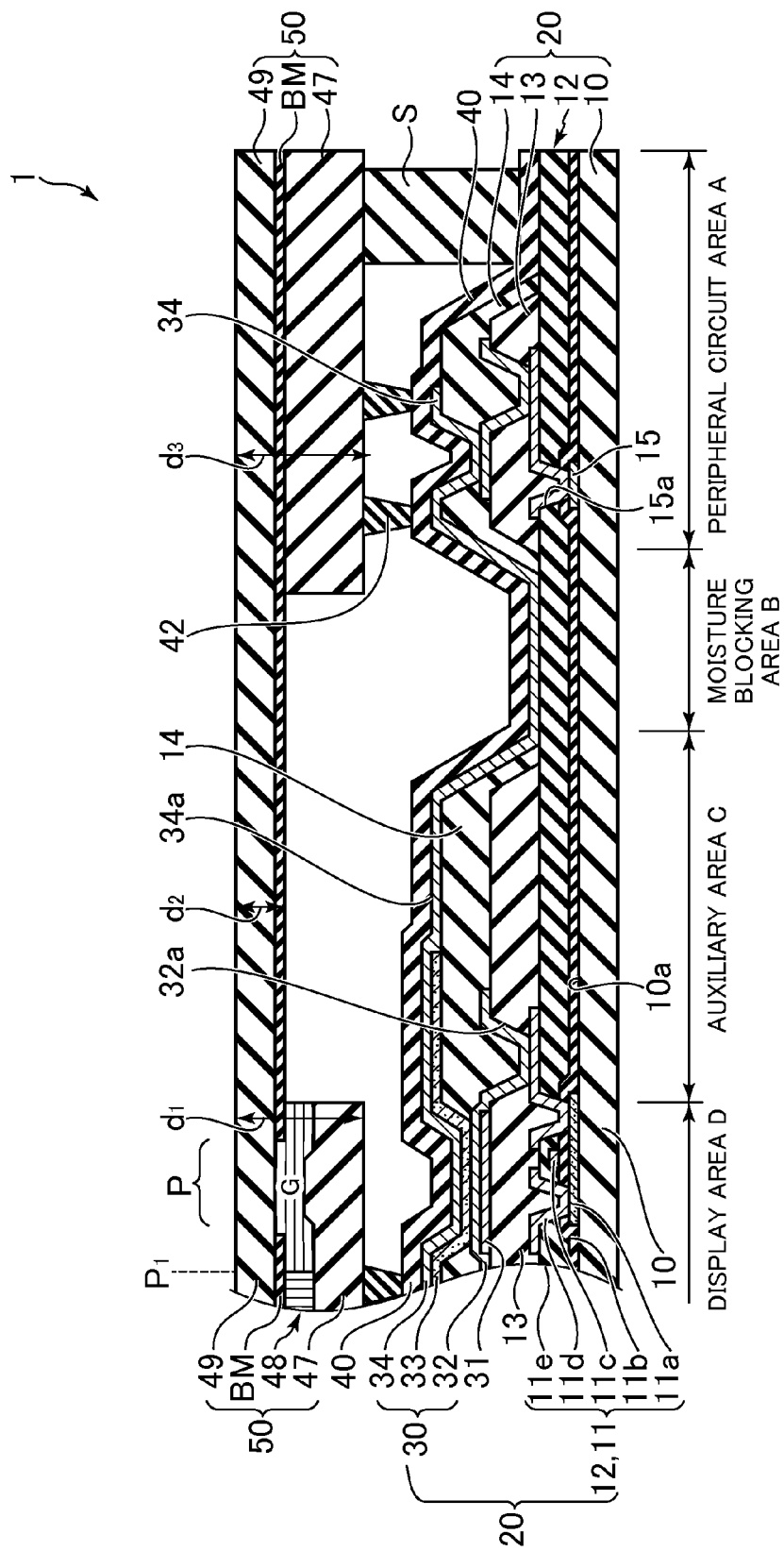
FIG. 6 is a schematic cross-sectional view illustrating yet another modification of the organic electroluminescence display device illustrated in FIG. 2, in the same view as that in FIG. 2.

For example, a distance between the counter substrate 50 and the thin film transistor substrate 20 may be held with the arrangement of a spacer 42. FIG. 6 is a schematic cross-sectional view illustrating yet another modification of the organic electroluminescence display device 1 illustrated in FIG. 2, in the same view as that in FIG. 2. As illustrated in FIG. 6, the spacer 42 made of an insulating material is arranged between the area of the counter substrate 50 opposite to the display area D, and the sealing film 40, to thereby keep a distance between the counter substrate 50 and the thin film transistor substrate 20. When the spacer 42 is thus arranged, a gap between the counter substrate 50 and the thin film transistor substrate 20 may not be filled with the filler 45.

When the thickness $d_3$ of the area of the counter substrate 50 opposite to the peripheral circuit area A is thicker than the thickness $d_2$ of the area of the counter substrate 50 opposite to the auxiliary area C and the moisture blocking area B, the spacer 42 is also arranged between the sealing film 40 and the counter substrate 50 in the peripheral circuit area A.

The spacer 42 is arranged between the area of the counter substrate 50 opposite to the display area D, and the sealing film 40, to thereby keep a distance between the counter substrate 50 and the thin film transistor substrate 20. Even if the gap between the counter substrate 50 and the thin film transistor substrate 20 is filled with the filler 45, as compared with the organic electroluminescence display device without the above configuration, the pressure applied to the sealing film 40 through the filler 45 in the auxiliary area C is suppressed.

Also, even if the gap between the counter substrate 50 and the thin film transistor substrate 20 is not filled with the filler 45, the gap between the counter substrate 50 and the thin film transistor substrate 20 is kept. As a result, the pressure can be prevented from being applied to the sealing film 40 in the auxiliary area C, and the organic electroluminescence display device 1 can be reduced in weight.

The embodiment of the invention has been described above. However, the invention is not limited to the above-mentioned embodiment. For example, the configuration described in the above embodiment can be replaced with the substantially same configuration, a configuration having the identical function effects, or a configuration that can achieve the same purpose.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic electroluminescence display device, comprising:
   a thin film transistor substrate in which anodes formed in respective pixels in a display area of a first substrate, an organic layer that comes in contact with the anodes and includes at least a light emitting layer, a cathode that covers the organic layer over the overall display area, and a sealing film that covers the overall first substrate are formed on the first substrate which is an insulating substrate in order; and a counter substrate that is arranged on the sealing film and has a second substrate which is an insulating substrate as a base material, wherein the thin film transistor substrate includes:

a moisture blocking area that surrounds an outside of the display area and is made of only an inorganic material between the first substrate and the sealing film, and an auxiliary area between the display area and the moisture blocking area, and a thickness of areas of the counter substrate opposite to the auxiliary area and the moisture blocking area is thinner than a thickness of an area of the counter substrate opposite to the display area.

2. The organic electroluminescence display device according to claim 1, wherein the counter substrate has a protective film that faces at least the display area on a surface of the second substrate on the insulating film side, and the counter substrate has no protective film in areas opposite to the auxiliary area and the moisture blocking area so that the thickness of the areas of the counter substrate opposite to the auxiliary area and the moisture blocking area is thinner than the thickness of the area of the counter substrate opposite to the display area.

3. The organic electroluminescence display device according to claim 2, wherein the counter substrate has a light blocking film formed in at least the area of the counter substrate opposite to a boundary of the pixels in the display area between the second substrate and the protective film, and the counter substrate has no light blocking film in areas opposite to the auxiliary area and the moisture blocking area so that the thickness of the areas of the counter substrate opposite to the auxiliary area and the moisture blocking area is thinner than the thickness of the area of the counter substrate opposite to the display area.

4. The organic electroluminescence display device according to claim 1, wherein the thin film transistor substrate has a peripheral circuit area that surrounds an outside of the moisture blocking area, and the thickness of the areas of the counter substrate opposite to the auxiliary area and the moisture blocking area is thinner than the thickness of the area of the counter substrate opposite to the peripheral circuit area.

5. The organic electroluminescence display device according to claim 4, wherein the counter substrate has color filters that pass a light of a given wavelength region in areas opposite to the respective pixels in the display area between the protective film and the light blocking film, and the color filters are formed in the area of the counter substrate opposite to the peripheral circuit area.

6. The organic electroluminescence display device according to claim 4, wherein the thin film transistor substrate has a peripheral circuit area that surrounds an outside of the moisture blocking area, and the thickness of the area of the counter substrate opposite to the peripheral circuit area is thinner than the thickness of the area of the counter substrate opposite to the display area.

7. The organic electroluminescence display device according to claim 1, wherein a spacer is arranged between the counter substrate and the sealing film in the display area to hold a distance between the counter substrate and the sealing film.

\* \* \* \* \*